(12) United States Patent
Wheeler et al.

(10) Patent No.: US 7,093,224 B2
(45) Date of Patent: Aug. 15, 2006

(54) MODEL-BASED LOGIC DESIGN

(75) Inventors: William R. Wheeler, Southborough, MA (US); Matthew J. Adiletta, Worcester, MA (US); Christopher Clark, Hopkinton, MA (US); Timothy J. Fennel, Holliston, MA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/941,158

(22) Filed: Aug. 28, 2001

(65) Prior Publication Data

US 2003/0046649 A1 Mar. 6, 2003

(51) Int. Cl.
*G06F 17/50* (2006.01)

(52) U.S. Cl. ............................................. 716/18
(58) Field of Classification Search .................. 716/18, 716/1; 703/2, 14
See application file for complete search history.

(56) References Cited

U.S. PATENT DOCUMENTS

| 4,703,435 A | 10/1987 | Darringer et al. |
| 4,970,664 A | 11/1990 | Kaiser et al. |
| 5,128,871 A | 7/1992 | Schmitz |
| 5,212,650 A | 5/1993 | Hooper et al. |

(Continued)

FOREIGN PATENT DOCUMENTS

| EP | 0 404 482 | 12/1990 |
| EP | 0 433 066 | 6/1991 |
| EP | 0 720 233 | 7/1996 |
| EP | 0 901 088 | 3/1999 |
| EP | 1 065 611 | 1/2001 |
| JP | 58-060559 | 4/1983 |
| JP | 03-225523 | 10/1991 |
| JP | 07-049890 | 2/1995 |
| JP | 08-314892 | 11/1996 |
| JP | 2001-068994 | 3/2001 |
| WO | WO 98/37475 | 8/1998 |
| WO | WO 98/55879 | 12/1998 |
| WO | WO 99/39268 | 8/1999 |
| WO | WO00/65492 | 11/2000 |

OTHER PUBLICATIONS

Gassenfeit, E. H., "Control System Design Realization via VHDL–A: Requirements", Proceedings of the 1996 IEEE International Symposium on Computer–Aided Control System Design, Sep. 15, 1996, pp. 282–285.

Kutzschebauch, "Efficient logic optimization using regularity extraction", Proceedings of 2000 International Conference on Computer Design, Sep. 17, 2000, pp. 487–493.

Lahti, et al., "SADE: a Graphical Toll for VHDL–Based System Analysis", 1991 IEEE International Conference on Computer–Aided Design, Nov. 11, 1991, pp. 262–265.

Lin, et al., "A Goal Tree Based High–Level Test Planning System for DSP Real Number Models", 1998 Proceedings of International Test Conference, Oct. 18, 1998, pp. 1000–1009.

(Continued)

*Primary Examiner*—Stacy A. Whitmore
(74) *Attorney, Agent, or Firm*—Fish & Richardson P.C.

(57) ABSTRACT

A technique for designing a logic circuit includes specifying a model. The model including combinatorial blocks, state elements and graphical library elements. The technique maintains a data structure representative of the model, and generates an architectural model and an implementation model from the data structure. The data structure represents a descriptive net list of the model. The architectural model includes C++ code and the implementation model includes Verilog.

23 Claims, 2 Drawing Sheets

U.S. PATENT DOCUMENTS

| | | | | |
|---|---|---|---|---|
| 5,220,512 | A | 6/1993 | Watkins et al. | |
| 5,258,919 | A | 11/1993 | Yamanouchi et al. | |
| 5,267,175 | A | 11/1993 | Hooper | |
| 5,278,769 | A | 1/1994 | Bair et al. | |
| 5,287,289 | A | 2/1994 | Kageyama et al. | |
| 5,297,053 | A | 3/1994 | Pease et al. | |
| 5,301,318 | A | 4/1994 | Mittal | |
| 5,384,710 | A | 1/1995 | Lam et al. | |
| 5,475,605 | A | 12/1995 | Lin | |
| 5,493,507 | A | 2/1996 | Shinde et al. | |
| 5,506,788 | A | 4/1996 | Cheng et al. | |
| 5,513,119 | A | 4/1996 | Moore et al. | |
| 5,544,067 | A | 8/1996 | Rostoker et al. | |
| 5,553,002 | A | 9/1996 | Dangelo et al. | |
| 5,568,397 | A | 10/1996 | Yamashita et al. | |
| 5,598,347 | A | 1/1997 | Iwasaki | |
| 5,603,015 | A | 2/1997 | Kurosawa et al. | |
| 5,604,894 | A | 2/1997 | Pickens et al. | |
| 5,629,857 | A | 5/1997 | Brennan | |
| 5,663,662 | A | 9/1997 | Kurosawa | |
| 5,666,289 | A | 9/1997 | Watkins | |
| 5,673,198 | A | 9/1997 | Lawman et al. | |
| 5,685,006 | A | 11/1997 | Shiraishi | |
| 5,694,579 | A | 12/1997 | Razdan et al. | |
| 5,706,476 | A | 1/1998 | Giramma | |
| 5,717,928 | A | 2/1998 | Campmas et al. | |
| 5,724,250 | A | 3/1998 | Kerzman et al. | |
| 5,757,655 | A | 5/1998 | Shih et al. | |
| 5,809,283 | A | 9/1998 | Vaidyanathan et al. | |
| 5,828,581 | A | 10/1998 | Matumura | |
| 5,831,869 | A | 11/1998 | Ellis et al. | |
| 5,841,663 | A | 11/1998 | Sharma et al. | |
| 5,852,564 | A | 12/1998 | King et al. | |
| 5,889,677 | A | 3/1999 | Yasuda et al. | |
| 5,892,678 | A | 4/1999 | Tokunoh et al. | |
| 5,892,682 | A | 4/1999 | Hasley et al. | |
| 5,903,469 | A | 5/1999 | Ho | |
| 5,933,356 | A | 8/1999 | Rostoker et al. | |
| 5,937,190 | A | 8/1999 | Gregory et al. | |
| 5,963,724 | A | 10/1999 | Mantooth et al. | |
| 5,974,242 | A | 10/1999 | Damarla et al. | |
| 6,044,211 | A | 3/2000 | Jain | |
| 6,053,947 | A | * 4/2000 | Parson | 703/14 |
| 6,066,179 | A | 5/2000 | Allan | |
| 6,077,304 | A | 6/2000 | Kasuya | |
| 6,106,568 | A | 8/2000 | Beausang et al. | |
| 6,117,183 | A | 9/2000 | Teranishi et al. | |
| 6,120,549 | A | 9/2000 | Goslin et al. | |
| 6,132,109 | A | 10/2000 | Gregory et al. | |
| 6,135,647 | A | * 10/2000 | Balakrishnan et al. | 716/18 |
| 6,152,612 | A | * 11/2000 | Liao et al. | 703/23 |
| 6,161,211 | A | 12/2000 | Southgate | |
| 6,178,541 | B1 | 1/2001 | Joly et al. | |
| 6,205,573 | B1 | 3/2001 | Hasegawa | |
| 6,208,954 | B1 | 3/2001 | Houtchens | |
| 6,216,256 | B1 | 4/2001 | Inoue et al. | |
| 6,219,822 | B1 | 4/2001 | Griestede et al. | |
| 6,226,780 | B1 | 5/2001 | Bahra et al. | |
| 6,233,540 | B1 | * 5/2001 | Schaumont et al. | 703/14 |
| 6,233,723 | B1 | 5/2001 | Pribetich | |
| 6,234,658 | B1 | 5/2001 | Houldsworth | |
| 6,236,956 | B1 | 5/2001 | Mantooth et al. | |
| 6,260,179 | B1 | 7/2001 | Ohsawa et al. | |
| 6,272,671 | B1 | 8/2001 | Fakhry | |
| 6,275,973 | B1 | 8/2001 | Wein | |
| 6,292,931 | B1 | 9/2001 | Dupenloup | |
| 6,298,468 | B1 | 10/2001 | Zhen | |
| 6,311,309 | B1 | 10/2001 | Southgate | |
| 6,324,678 | B1 | 11/2001 | Dangelo et al. | |
| 6,327,693 | B1 | 12/2001 | Cheng et al. | |
| 6,353,806 | B1 | 3/2002 | Gehlot | |
| 6,353,915 | B1 | 3/2002 | Deal et al. | |
| 6,360,356 | B1 | 3/2002 | Eng | |
| 6,366,874 | B1 | 4/2002 | Lee et al. | |
| 6,378,115 | B1 | 4/2002 | Sakurai | |
| 6,381,563 | B1 | 4/2002 | O'Riordan et al. | |
| 6,381,565 | B1 | 4/2002 | Nakamura | |
| 6,401,230 | B1 | 6/2002 | Ahanessians et al. | |
| 6,421,816 | B1 | 7/2002 | Ishikura | |
| 6,438,729 | B1 | 8/2002 | Ho | |
| 6,438,731 | B1 | 8/2002 | Segal | |
| 6,440,780 | B1 | 8/2002 | Kimura et al. | |
| 6,449,762 | B1 | 9/2002 | McElvain | |
| 6,457,164 | B1 | 9/2002 | Hwang et al. | |
| 6,473,885 | B1 | 10/2002 | Wallace | |
| 6,477,683 | B1 | 11/2002 | Killian et al. | |
| 6,477,688 | B1 | 11/2002 | Wallace | |
| 6,477,689 | B1 | * 11/2002 | Mandell et al. | 716/11 |
| 6,480,985 | B1 | * 11/2002 | Reynolds et al. | 716/1 |
| 6,487,698 | B1 | * 11/2002 | Andreev et al. | 716/3 |
| 6,490,545 | B1 | 12/2002 | Peng | |
| 6,505,328 | B1 | 1/2003 | Van Ginneken et al. | |
| 6,505,341 | B1 | 1/2003 | Harris et al. | |
| 6,516,456 | B1 | 2/2003 | Garnett et al. | |
| 6,519,742 | B1 | 2/2003 | Falk | |
| 6,519,755 | B1 | * 2/2003 | Anderson | 716/18 |
| 6,523,156 | B1 | 2/2003 | Cirit | |
| 6,539,536 | B1 | 3/2003 | Singh et al. | |
| RE38,059 | E | 4/2003 | Yano et al. | |
| 6,546,528 | B1 | 4/2003 | Sasaki et al. | |
| 6,574,787 | B1 | 6/2003 | Anderson | |
| 6,591,407 | B1 | 7/2003 | Kaufman et al. | |
| 2001/0018758 | A1 | 8/2001 | Tanaka et al. | |
| 2002/0023256 | A1 | * 2/2002 | Seawright | 716/18 |
| 2002/0038447 | A1 | * 3/2002 | Kim et al. | 716/4 |
| 2002/0042904 | A1 | 4/2002 | Ito et al. | |
| 2002/0046386 | A1 | 4/2002 | Skoll et al. | |
| 2002/0049957 | A1 | 4/2002 | Hosono et al. | |
| 2002/0059054 | A1 | * 5/2002 | Bade et al. | 703/20 |
| 2002/0112221 | A1 | 8/2002 | Ferreri et al. | |
| 2002/0138244 | A1 | 9/2002 | Meyer | |
| 2002/0166100 | A1 | 11/2002 | Meding | |
| 2003/0004699 | A1 | 1/2003 | Choi et al. | |
| 2003/0005396 | A1 | 1/2003 | Chen et al. | |
| 2003/0016206 | A1 | * 1/2003 | Taitel | 345/103 |
| 2003/0016246 | A1 | * 1/2003 | Singh | 345/763 |
| 2003/0036871 | A1 | 2/2003 | Fuller et al. | |
| 2003/0177455 | A1 | 9/2003 | Kaufman et al. | |

OTHER PUBLICATIONS

Maxfield, C., "Digital Logic Simulation: Event–Driven, Cycle–Based, and Home–Brewed", *Electrical Design News*, 41(14):129–136 (1996).

NB84035598, "Binary Relational Schema to Model Structured LSI Design", IBM Technical Disclosure Bulletin, vol. 26, No. 10B, Mar. 1984, pp. 5598–5601.

NN7807629, "Functional Oriented Symbolic Macromodeling Algorithm", IBM Technical Disclosure Bulletin, vol. 21, No. 2, Jul. 1978, pp. 629–631.

NN8006341, "Macro Physical–To–Logical Checking LSI Chip Design", IBM Technical Disclosure Bulletin, vol. 23, No. 1, Jun. 1980, pp. 341–345.

NN9407481, "Functional Modeling using object Collaboration Diagram", IBM Technical Disclosure Bulletin, vol. 37, No. 7, Jul. 1994, pp. 481–486.

Parlakbilek, et al., "A Multiple–Strength Multiple–Delay Compiled–Code Logic Simulator", *IEEE Transactions on Computer–Aided Design of Integrated Circuits and Systems*, 12(12):1937–1946 (1993).

Su, Stephen, "An Interactive Design Automation System", *Proceedings of the 10th Design Automation Workshop on Design Automation,* pp. 253–261, Jun. 1973.

Yli–Pietila, et al., "The Design and Simulation of Complex Multitechnology Systems", IEEE International Conference on Systems Engineering, Aug. 9, 1990, pp. 474–477.

Foley et al., "An Object Based Graphical User Interface for Power Systems", IEEE Transactions on Power Systems, vol. 8, No. 1, Feb. 1993, pp. 97–104.

Pedram et al., "Floorplanning with Pin assignment", 1990 IEEE International Conference on Computer–Aided Design, Nov. 11, 1990, pp. 98–101.

Renoir, HDL Design Datasheet, Mentor Graphics, 1–8, 1999.

Mentor Graphics Corporation, Renoir™ With HDL2Graphics™, pp. 1–6, 1998, Oregon.

Mentor Graphics Corporation, Renoir HDL Design Datasheet, pp. 1–2, 1999, Oregon.

Computer Design, "After Hard Knocks, Cycle–Based Simulators Stand Their Ground". http://www.computer–design.com/Editorial/1996/10/ASIC/after.html, accessed on Aug. 23, 2001, pp. 1–5.

* cited by examiner

MODEL-BASED LOGIC DESIGN

TECHNICAL FIELD

This invention relates to model-based logic design.

BACKGROUND

Microprocessor logic design typically includes an architectural stage and an implementation stage.

The architectural stage includes designing a framework of functional units that provide performance and functionality of a new microprocessor. This framework is typically captured in a text-based document. A model of the new microprocessor, represented in a high level language such as C++, is generated to verify that the function and performance requirements are met.

The implementation stage involves taking the model and the text-based document from the architectural stage and generating a Hardware Design Language (HDL) file.

DETAILED DESCRIPTION

Figure 1:
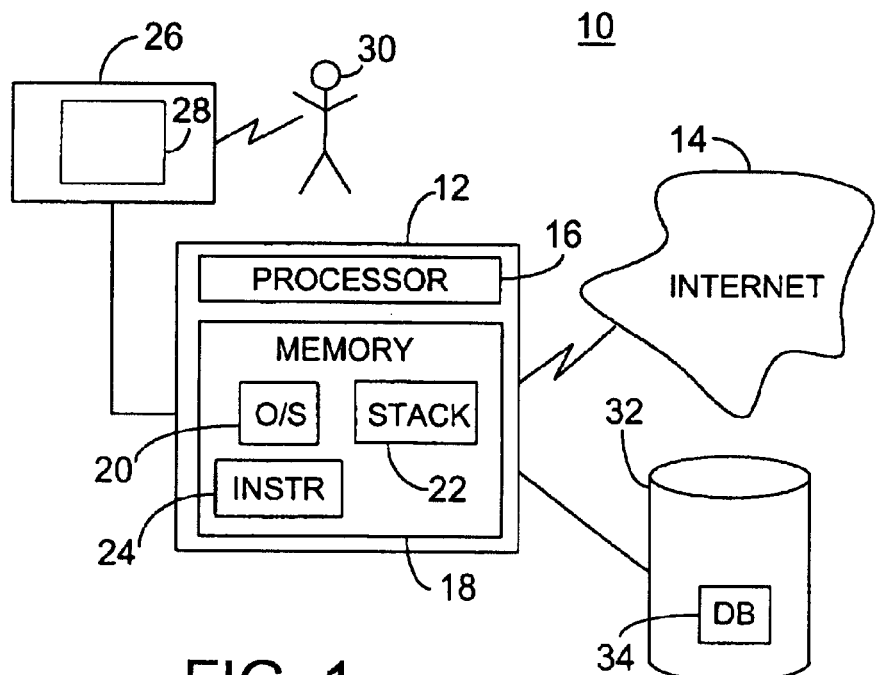
FIG. 1 shows a system.

Referring to FIG. 1, a system 10 includes a computer 12, such as a personal computer (PC). The computer 12 may be connected to a network 14, such as the Internet, that runs TCP/IP (Transmission Control Protocol/Internet Protocol) or another suitable protocol. Connections may be via Ethernet, wireless link, or telephone line.

The computer 12 contains a processor 16 and a memory 18. Memory 18 stores an operating system (O/S) 20 such as Windows2000® or Linux, a TCP/IP protocol stack 22 for communicating over network 14, and machine-executable instructions 24 executed by processor 16 to perform a logic modeling process 100 below. The computer 12 also includes an input/output (I/O) device 26 for display of a graphical user interface (GUI) 28 to a user 30 and a storage device 32 for storing a database 34.

The logic modeling process 100 executes in the computer 12. The logic modeling process 100 is a process in which a C++ model file and a Hardware Design Language (HDL) file, such as a Verilog (IEEE Standard 1364) file or a Very high speed integrated circuit Hardware Design Language (VHDL) (IEEE Standard 1076) file, are generated from a successively refined graphical model. Verilog is a hardware description language, a textual format for describing electronic circuits and systems, applied to electronic design. Verilog is used for verification through simulation, for timing analysis, for test analysis (testability analysis and fault grading) and for logic synthesis.

Figure 2:
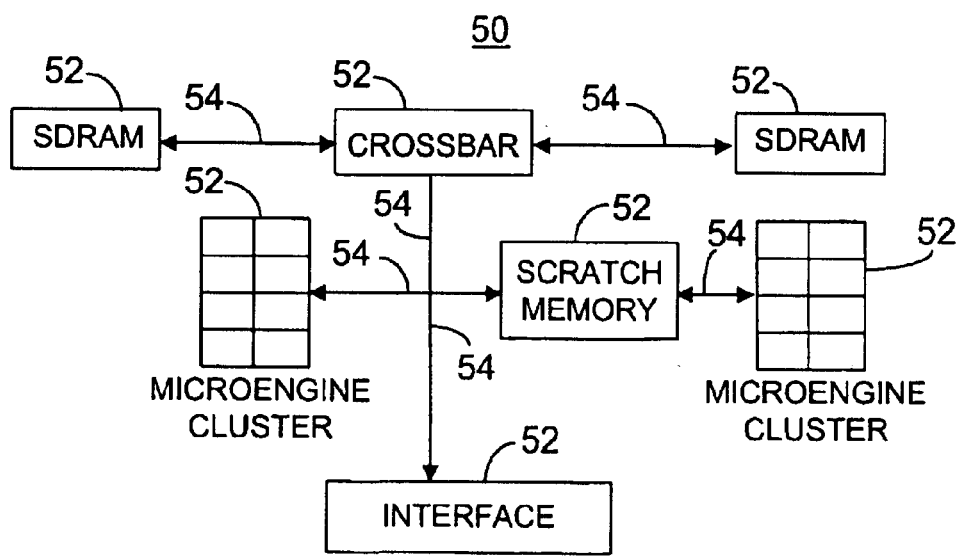
FIG. 2 shows a graphical model.

Referring to FIG. 2, a graphical model 50 is a pictorial model of a microprocessor design. The graphical model 50 is a tool that blends the use of textual description and graphical description of logical elements to hierarchically capture a silicon design. The use of graphics is important to "re-use" capability and for design support. The graphical model 50 is represented in database 34 to enable production of a cycle-accurate high performance simulation model as well as a synthesizable Verilog model.

The graphical model 50 includes of a set of blocks 52, interconnected by lines 54. Each of the blocks 52 represents logical elements of a device under design. The lines 54 represent connections of block inputs to block outputs. Every block in the graphical model 50 is an instance of a specific type of block. The type of block determines the relationship between a block's outputs and its inputs, states, and time. The graphical model 50 may contain any number of instances of any type of block needed to model a system.

Although not illustrated in FIG. 2, each of the blocks 52 and lines 54 are linked to a Register Transfer Diagram (RTD) descriptions allowing the user 30 to navigate and drill down to a particular place in the design quickly. This allows the user 30 to capture the design intent and then to successively refine the design. In a RTD view (not shown) of the graphical model 50 logic is color-coded. For example, state elements are shown in blue, semantically correct combinatorial logic is shown in green, common blocks describing pipe stages are shown in white, ports identifying inputs/outputs of the RTD are shown in yellow, and library elements with correctly matched inputs and outputs are shown in gray. Other schemes can also be used.

Each of the blocks 52 and corresponding lines 54 are stored in the database 34. More specifically, the blocks and corresponding connections are stored in one or more data structures that represent the gates, nodes and nets of the device. The data structures provide an internal list or description of a net list of the device is stored in the database 34.

Figure 3:
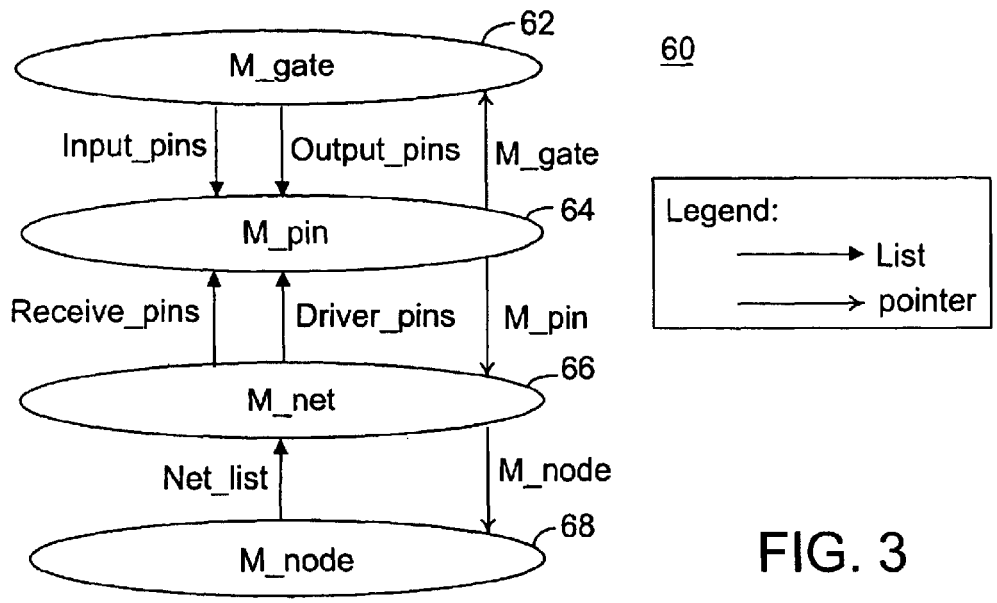
FIG. 3 shows a data structure.

Referring to FIG. 3, an exemplary data structure 60 implemented in C++ and stored in the database 34 and representing an exemplary description of a graphic model includes M-Gate (62), M_Pin (64), M_Net (66) and M_node (68), where "M" represents Model. The data structure may be implemented, for example, as a linked list or binary tree.

The M-Gate (62) represents a logical function, for example, AND, FF, FIFO, and so forth. The M_Gate (62) contains zero or more input pins (M_pin's) and zero or more output pins. Each distinct logical function in the graphical model 50 is assigned its own derived M_gate type.

The M_pin (64) represents a connection point to a gate. The connection may be either an input or output. It connects an M_gate to an M_net.

The M_node (66) represents the total extent (i.e. all bits) of a simulation state.

The M_Net (68) represents an arbitrary collection of bits within an M_node. An M_net connects one or more M_pin's together.

M-Gate (62), M_Pin (64), M_Net (66) and M_node (68) are all C++ classes in which there are multiple derived classes for each class listed above.

The data structure 60 is updated and reflects the current state of the graphical model 50. The data structure 60 is used by the logic modeling process 100 to generate an architectural model using, for example, C++ constraints, and a Verilog implementation model. Thus, a single database, i.e., the database 34, is used as generator of both an architectural and implementation model for a chip design.

Figure 4:
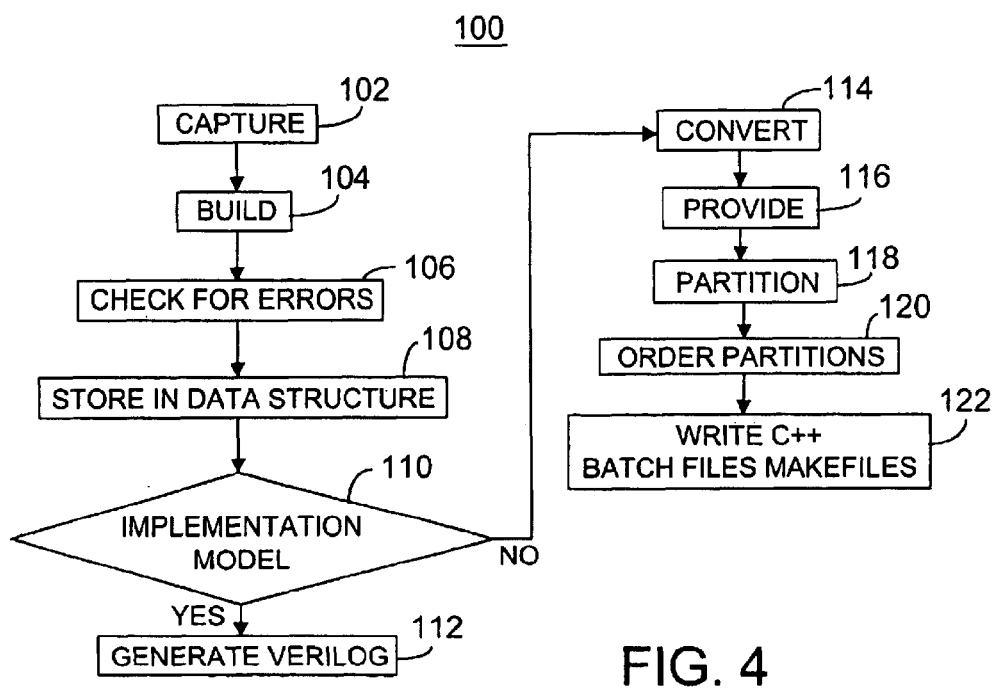
FIG. 4 shows a logic modeling process.

Referring to FIG. 4, the logic modeling process 100 includes graphically capturing (102) combinatorial blocks, state elements and graphical library elements. Graphics elements in the library may be definable or may have predefined functions. For example, the library may contain software objects that perform the function of a FF or a latch. The library may also contain graphics elements that are undefined, i.e., that have no code associated with them.

A block in a graphical model may represent a single combinatorial element, such as a multiplexer or state element. A combinatorial block represents the functionality of several combinatorial elements or the function of several state elements.

The process 100 builds (104) a control/design analysis and checks (106) for errors. For example, process 100 determines if there are any un-terminated or inconsistent connections in the design. If any such problems are detected, process 100 issues an error message to the logic designer. The error message may specify the nature of the problem and its location within the logic design. The logic designer is then given the opportunity to correct the problem before process 100 moves forward.

The process 100 stores (108) the logic of the graphics capture in a data structure. The process 100 determines (110) whether to write an architectural model or implementation model. If an implementation model is to be written, the process 100 generates (112) Verilog using Verilog constructs to provide the implementation model.

If an architectural model is to be written, the process 100 coverts (114) the data structure into a C++ topology. The process provides (116) timing and clock domain assignments partitions (118) clock domain topologies. Each partition is coded ordered (120) and partition code provided to a C++ compiler.

Code ordering means that the logical constructs are sorted based on producer/consumer relationships. That is, a logical construct representing an element that "produces" or outputs a signal is ordered before another element that "consumes" or receives the signal as an input. By subsequently code-ordering the C++ model may be simulated as a single call model. A single call model means that each logical construct is evaluated only once per cycle. Hence, the C++ model simulator is a cycle-based simulator. The Verilog model is also written after being extracted from the data structure and is typically simulated using an event driven simulator such as ModelSim™ from Model Technology, for example.

The process writes (122) C++ files, batch files and makefiles for the architectural model. Thus, process 100 generates high performance C++ and highly efficient Verilog from the same database.

Process 100 may be implemented using one or more computer programs executing on programmable computers that each includes a processor, a storage medium readable by the processor (including volatile and non-volatile memory and/or storage elements), at least one input device, and one or more output devices.

Each such program may be implemented in a high level procedural or object-oriented programming language to communicate with a computer system. Also, the programs can be implemented in assembly or machine language. The language may be a compiled or an interpreted language.

Each computer program may be stored on a storage medium or device (e.g., CD-ROM, hard disk, or magnetic diskette) that is readable by a general or special purpose programmable computer for configuring and operating the computer when the storage medium or device is read by the computer to perform process 100.

Process 100 may also be implemented as a computer-readable storage medium, configured with a computer program, where, upon execution, instructions in the computer program cause the computer to operate in accordance with process 50.

Further aspects, features and advantages will become apparent from the following.

What is claimed is:

1. A method comprising:
   generating a functional design of a logic circuit by selecting, placing, and connecting graphical elements using a graphical user interface (GUI), the graphical elements representing elements of the logic circuit, the elements comprising state elements, combinatorial logic, reusable library elements, and elements containing textual description of logic;
   receiving an input through the GUI;
   refining the functional design to represent a hardware design of the logic circuit using the input to modify the connectivity of the graphical elements;
   maintaining a data structure representative of the functional design; and
   generating an architectural, cycle-based simulation model of the functional design of the logic circuit and separate implementation hardware description language (HDL) model of the hardware design of the logic circuit from the data structure, the implementation HDL model functionally equivalent to the architectural, cycle-based simulation model.

2. The method of claim 1 wherein the data structure comprises a description of a net list.

3. The method of claim 2 wherein the data structure comprises:
   elements representing logical functions;
   elements representing connection points to gates;
   elements representing all bits of a simulation state; and
   elements representing an arbitrary collection of bits within the simulation state.

4. The method of claim 3 wherein the elements comprise C++ classes used to generate the architectural, cycle-based simulation model.

5. The method of claim 1 wherein the architectural, cycle-based simulation model comprises C++ software code.

6. The method of claim 1 wherein the HDL is Verilog.

7. The method of claim 1 wherein the HDL is Very high speed integrated circuit Hardware Design Language (VHDL).

8. A method comprising:
   generating a model containing combinatorial blocks, state elements, reusable library elements, and elements containing textual description of logic using a graphical user interface (GUI), the model representing a functional design of a logic circuit;
   receiving an input through the GUI;
   refining the model to represent a hardware design of the logic circuit using the input;
   maintaining a descriptive net list of the model; and
   generating a C++ architectural, cycle-based simulation model and a functionally equivalent implementation Verilog model from the descriptive net list.

9. The method of claim 8 wherein the net list comprises gates, nodes and nets.

10. The method of claim 8 wherein maintaining comprises parsing and analyzing the combinatorial blocks, state elements, reusable library elements, and elements containing textual description of logic of the model.

11. The method of claim 8, wherein generating the C++ architectural, cycle-based simulation model and the functionally equivalent implementation Verilog model comprises:
    partitioning a topology of the net list into a plurality of partitions; and
    code ordering each of the partitions.

12. A computer program product residing on a computer readable medium having instructions stored thereon which, when executed by the processor, cause the processor to:

generate a model containing combinatorial blocks, state elements, reusable library elements, and elements containing textual description of logic using a graphical user interface (GUI), the model representing a functional design of the logic circuit;

receive an input through the GUI;

refine the model with the input to represent a hardware design of the logic circuit;

maintain a descriptive net list of the model; and generate a C++ architectural, cycle-based simulation model and a functionally equivalent implementation Verilog model from the descriptive net list.

13. The computer product of claim 12, wherein the computer readable medium is a random access memory (RAM).

14. The computer product of claim 12, wherein the computer readable medium is a read only memory (ROM).

15. The computer product of claim 12, wherein the computer readable medium is a hard disk drive.

16. A processor and memory configured to:

generate a model containing combinatorial blocks, state elements, reusable library elements, and elements containing textual description of logic using a graphical user interface, the model representing a functional design of the logic circuit;

refine the model to represent a hardware design of the logic circuit;

maintain a descriptive net list of the model; and generate a C++ architectural, cycle-based simulation model and a functionally equivalent implementation Verilog model from the descriptive net list.

17. The processor and memory of claim 16 wherein the processor and memory are incorporated into a personal computer.

18. The processor and memory of claim 16 wherein the processor and memory are incorporated into a network server residing in the Internet.

19. The processor and memory of claim 16 wherein the processor and memory are incorporated into a single board computer.

20. A system comprising:

a graphic user interface (GUI) for receiving selections of graphical elements to generate a model and displaying the model, the model containing combinatorial blocks, state elements, library elements, and elements containing textual description of logic, the model representing a functional, performance based model and a functionally equivalent implementation hardware design of a logic circuit;

a maintenance process to manage a data structure representing a descriptive net list of the model; and a code generation process to generate a C++ architectural, cycle-based simulation model and a functionally equivalent implementation Verilog model from the data structure.

21. The system of claim 20 wherein the data structure comprises gates, nodes and nets.

22. The system of claim 20 wherein the maintenance process comprises parsing and analyzing the combinatorial blocks, state elements, reusable library elements, and elements containing textual description of logic of the model.

23. The system of claim 20 wherein the code generation process comprises:

partitioning a topology of the net list into a plurality of partitions; and code ordering each of the partitions.

* * * * *